(12) United States Patent
Jansson

(10) Patent No.: US 6,778,110 B2
(45) Date of Patent: Aug. 17, 2004

(54) BUBBLE HANDLING A/D CONVERTER CALIBRATION

(75) Inventor: Christer Jansson, Linköping (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/668,000

(22) Filed: Sep. 22, 2003

(65) Prior Publication Data

US 2004/0108949 A1 Jun. 10, 2004

Related U.S. Application Data

(63) Continuation of application No. PCT/SE02/00562, filed on Mar. 22, 2002.

(30) Foreign Application Priority Data

Mar. 26, 2001 (SE) .............................................. 0101080

(51) Int. Cl.$^7$ ............................................... H03M 1/10
(52) U.S. Cl. ...................................... 341/120; 341/155
(58) Field of Search ................................ 341/120, 118, 341/155, 159

(56) References Cited

U.S. PATENT DOCUMENTS

| | | | | |
|---|---|---|---|---|
| 4,712,087 A | * | 12/1987 | Traa | 341/118 |
| 5,029,305 A | | 7/1991 | Richardson | 341/159 |
| 5,633,636 A | * | 5/1997 | Reyhani | 341/97 |
| 5,959,564 A | | 9/1999 | Gross, Jr. | 341/160 |
| 5,995,028 A | | 11/1999 | Tai | 341/100 |
| 6,388,602 B1 | * | 5/2002 | Yang | 341/159 |
| 6,480,135 B2 | * | 11/2002 | Gendai | 341/159 |
| 6,633,250 B2 | * | 10/2003 | Lee et al. | 341/160 |

* cited by examiner

*Primary Examiner*—Peguy JeanPierre
(74) *Attorney, Agent, or Firm*—Baker Botts L.L.P.

(57) ABSTRACT

An A/D converter includes a calibration apparatus handling occurrences of thermometer code bubbles in an A/D sub-converter in at least one A/D converter stage. The calibration apparatus includes means (30) for detecting two A/D sub-converter comparators causing a bubble, means (32, 34, 36) for increasing the threshold of the bubble causing comparator having the lowest threshold by a first predetermined voltage and means (32, 34, 36) for decreasing the threshold of the bubble causing comparator having the highest threshold by a second predetermined voltage.

15 Claims, 9 Drawing Sheets

BUBBLE HANDLING A/D CONVERTER CALIBRATION

CROSS REFERENCE TO RELATED APPLICATION

This application is a continuation of copending International Application No. PCT/SE02/00562 filed Mar. 22, 2002, and claiming a priority date of Mar. 26, 2001, which designates the United States.

TECHNICAL FIELD OF THE INVENTION

The present invention generally relates to handling of occurrences of bubbles on the thermometer code bus of a flash A/D converter or an A/D converter stage of a multi-stage A/D converter.

Flash A/D converters include a set of comparators that simultaneously convert an analog signal into thermometer code, which is converted into binary code. This conversion relies on detection of the location of the 1-to-0 transition in the thermometer code. However, due to component imperfections in the converter, there may in fact be several such transitions in the thermometer code. This is called a bubble or sparkle and leads to ambiguities in the conversion. References [1] S. Padoan, A. Boni, C. Morandi and R Venturi, "A novel coding scheme for the ROM of parallel ADCs, featuring reduced conversion noise in the case of single bubbles in the thermometer code", IEEE International Conference on Electronics, Circuits and Systems, 1998; [2] M. Sugawa, H. Yoshida, M. Mitsuishi, S. Nakamura, S. Nakaigawa, Y. Kunisaki and H. Suzuki, "A 2.5V 100 MS/s 8bit ADC using Pre Linearization Input Buffer and Level Up DAC/Subtractor", IEEE Symposium on VLSI Circuits Digest of Technical Papers, 1998; [3] Jy-Der David Tai, "Bubble evaporation circuit for eliminating bubble errors in thermal code and its method", U.S. Pat. No. 6,038,662 (as signed to Powerchip Semiconductor corp.); and [4] Andrew G. F. Dingwall, "Decoder error prevention apparatus for use in flash analog-to-digital converters", U.S. Pat. 5,023,613 (assigned to Harris Semiconductor Patents, Inc.); describe different algorithms for handling bubbles in the thermometer code. The purpose of these algorithms is to avoid catastrophic conversion errors in the thermometer-to-binary decoder due to the existence of a bubble. However, although these methods are bubble tolerant, they still produce large errors and they do not attempt to eliminate generation of future bubbles.

SUMMARY OF THE INVENTION

An object of the present invention is a calibration method and apparatus for a flash A/D converter or an A/D sub-converter in an A/D converter stage that reduce or eliminate occurrences of thermometer code bubbles.

This object can be achieved by a calibration method handling occurrences of thermometer code bubbles in an A/D sub-converter in an A/D converter stage, including the steps of:

detecting two A/D sub-converter comparators causing a bubble;

increasing the threshold of the bubble causing comparator having the lowest threshold by a first predetermined voltage; and decreasing the threshold of the bubble causing comparator having the highest threshold by a second predetermined voltage.

The first and second voltages can be fractions of the A/D sub-converter quantization step. The first voltage can be equal to the second voltage. The method may further include the steps of:

determining the last A/D sub-converter comparator having a threshold that is smaller than an analog A/D sub-converter input signal;

increasing the threshold of the determined comparator by a third predetermined voltage if a residual signal from the A/D converter stage falls below a predetermined minimum level; and decreasing the threshold of the first A/D sub-converter comparator having a threshold that is larger than the analog A/D subconverter input signal by a fourth predetermined voltage if the residual signal exceeds a predetermined maximum level. The third and fourth voltages can be fractions of the A/D sub-converter quantization step. The third voltage can be equal to the fourth voltage. The thresholds can be modified by modifying comparator offsets.

The object can also be achieved by a calibration apparatus handling occurrences of thermometer code bubbles in an A/D sub-converter in an A/D converter stage, comprising: means for detecting two A/D sub-converter comparators causing a bubble; means for increasing the threshold of the bubble causing comparator having the lowest threshold by a first predetermined voltage; and means for decreasing the threshold of the bubble causing comparator having the highest threshold by a second predetermined voltage.

The apparatus may further comprise means for determining the last A/D sub-converter comparator having a threshold that is smaller than an analog A/D sub-converter input signal; means for increasing the threshold of the determined comparator by a third predetermined voltage if a residual signal from the A/D converter stage falls below a predetermined minimum level; and means for decreasing the threshold of the first A/D sub-converter comparator having a threshold that is larger than the analog A/D sub-converter input signal by a fourth predetermined voltage if the residual signal exceeds a predetermined maximum level. The apparatus may further comprise means for modifying the thresholds by modifying comparator offsets.

The object can also be achieved by a multi-stage A/D converter including a calibration apparatus handling occurrences of thermometer code bubbles in an A/D sub-converter in at least one A/D converter stage, the calibration apparatus comprising means for detecting two A/D sub-converter comparators causing a bubble, means for increasing the threshold of the bubble causing comparator having the lowest threshold by a first predetermined voltage, and means for decreasing the threshold of the bubble causing comparator having the highest threshold by a second predetermined voltage.

The calibration apparatus may further comprise means for determining the last A/D subconverter comparator having a threshold that is smaller than an analog A/D sub-converter input signal, means for increasing the threshold of the determined, comparator by a third predetermined voltage if a residual signal from the A/D converter stage falls below a predetermined minimum level, and means for decreasing the threshold of the first A/D sub-converter comparator having a threshold that is larger than the analog A/D sub-converter input signal by a fourth predetermined voltage if the residual signal exceeds a predetermined maximum level. The multi-stage A/D converter may further comprise means for modifying the thresholds by modifying comparator offsets.

The object can also be achieved by a flash A/D converter handling occurrences of thermometer code bubbles, comprising means for detecting two A/D converter comparators causing a bubble, means for increasing the threshold of the bubble causing comparator having the lowest threshold by a first predetermined voltage, and means for decreasing the threshold of the bubble causing comparator having the highest threshold by a second predetermined voltage.

The flash A/D converter may further comprise means for modifying the thresholds by modifying comparator offsets.

Briefly, the present invention identifies the A/D converter comparators that are responsible for a detected bubble and adjusts their thresholds to reduce or eliminate the threshold crossover that caused the bubble. An advantage with this technique is that the A/D converter will eventually be bubble-free. This is an especially attractive feature for residual based correction methods in multi-stage A/D converters, such as pipeline, cyclic or sub-ranging A/D converters.

BRIEF DESCRIPTION OF THE DRAWINGS

The invention, together with further objects and advantages thereof, may best be understood by making reference to the following description taken together with the accompanying drawings, in which.

DETAILED DESCRIPTION OF THE PREFERRED EMBODIMENTS

In the following description the same reference designations will be used for the same or similar elements.

The description below will describe the present invention with reference to a pipeline A/D converter. However, it is appreciated that the same principles may also be used for other multi-stage A/D converters, such as cyclic or sub-ranging A/D converters (although a cyclic converter only includes one stage, for the purposes of this application it is still considered as a multi-stage converter, since the stage is used several times). Furthermore, the bubble handling method described below is also applicable to single-stage flash A/D converters.

Figure 1:
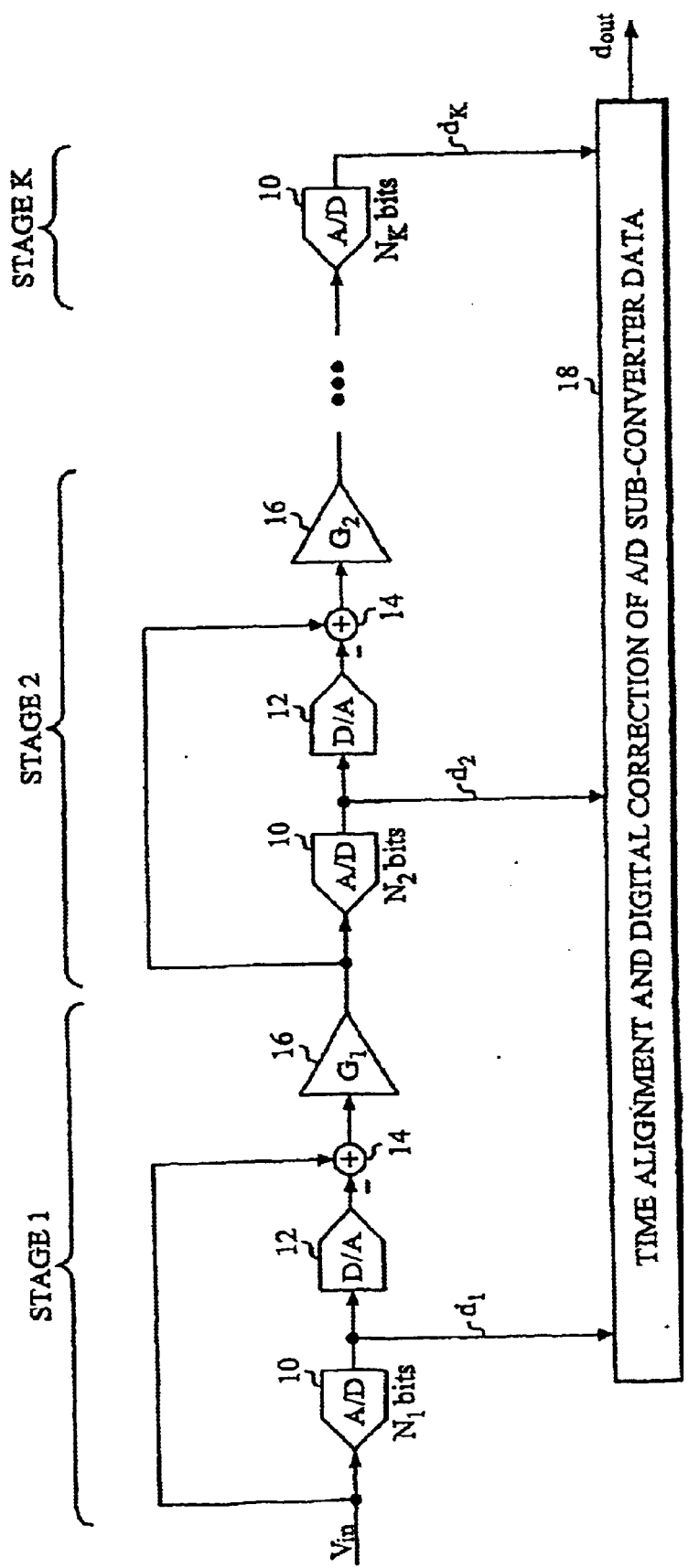
FIG. 1 is a block diagram of a typical pipeline A/D converter.

FIG. 1 is a block diagram of a typical pipeline A/D converter. An N-bit analog-to-digital conversion is performed in two or more stages, each stage extracting $\{N_1, N_2 \ldots N_K\}$ bits of information represented by the digital words $\{d_1, d_2 \ldots d_K\}$, where K is the number of pipeline stages. The first pipeline stage extracts the $N_1$ most significant bits using an $N_1$-bit A/D sub-converter 10. Then the estimated value is subtracted from the analog input signal Vin by using a D/A sub-converter 12 and an adder 14, leaving a residue containing the information necessary to extract less significant bits. Usually the residue is amplified by an amplifier 16 having a gain $G_1$ to establish the appropriate signal range for stage 2. These steps are repeated for all K stages, with the exception of the last pipeline stage, which does not need to produce an analog output and therefore has no D/A converter, adder or amplifier, but only an A/D converter 10. The digital words $\{d_1, d_2 \ldots d_K\}$ are then combined to form the digital output word $d_{out}$ in a unit 18 for time alignment and digital correction of A/D sub-converter data.

In order to simplify the following description, it is assumed that an A/D converter stage has a resolution of 3 bits. This number is sufficiently small to be manageable, but is also large enough to illustrate the essential features of a typical case. However, it is appreciated that in general the number of bits may be larger. This is especially the case for a single-stage flash A/D converter which typically may have a resolution of up to 10 bits.

Figure 2:
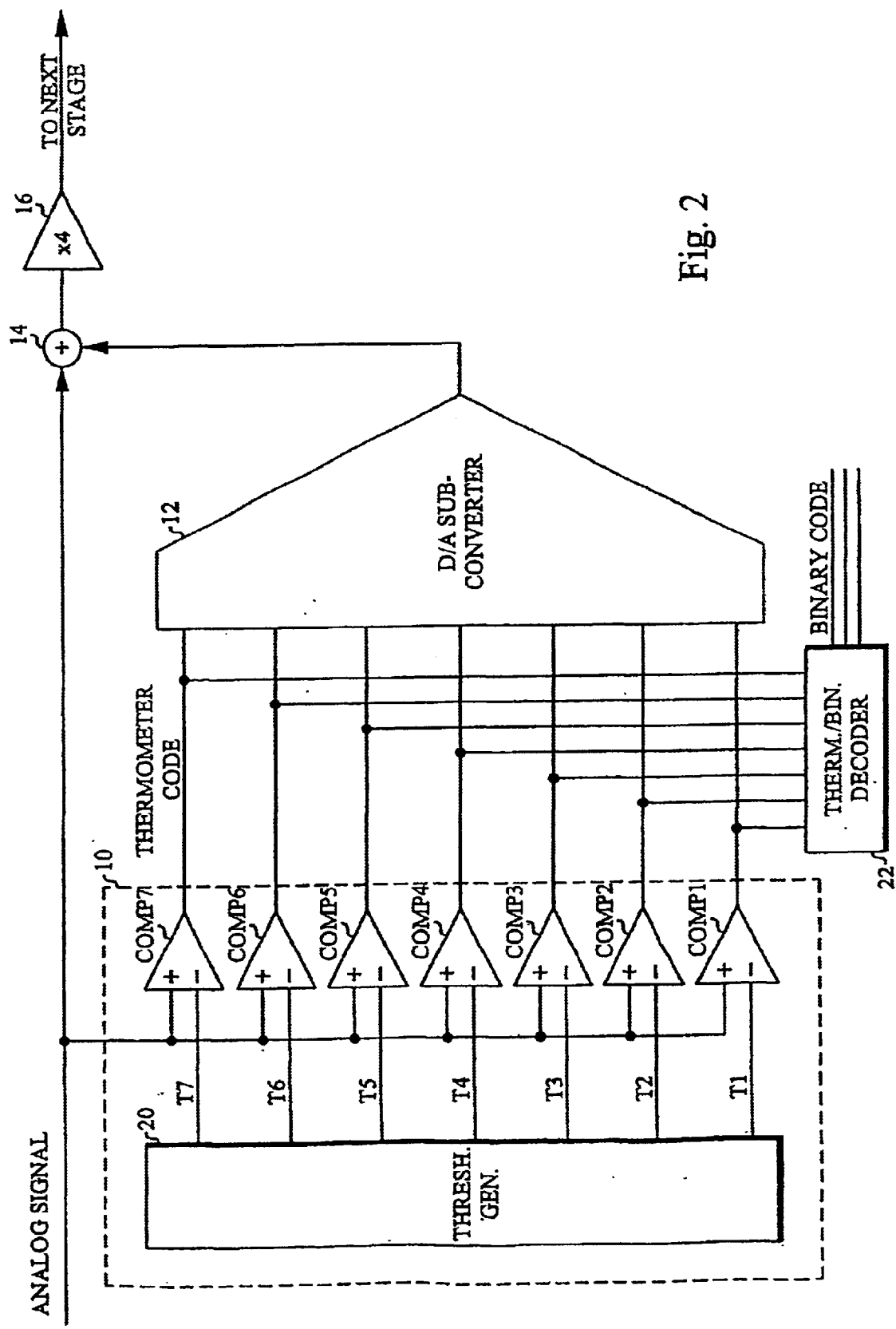
FIG. 2 is a block diagram of a typical stage of the A/D converter in FIG. 1.

FIG. 2 is a block diagram of a typical stage of the A/D converter in FIG. 1. A/D sub-converter 10 includes a number of comparators COMP1–COMP7. One input terminal of each comparator is connected to a corresponding reference or threshold voltage T1–T7. These threshold voltages are formed by a threshold generator 20. The other input terminal of each comparator receives the analog input signal (the same signal to each comparator). The output signals from the comparators collectively form the digitized value in thermometer code. These signals are forwarded to D/A sub-converter 12 over a thermometer code bus, where they are transformed into a corresponding analog value. This value is subtracted from the original analog value in adder 14, and the residual signal is amplified by a gain equal to 4 in gain element 16.

Figure 4:
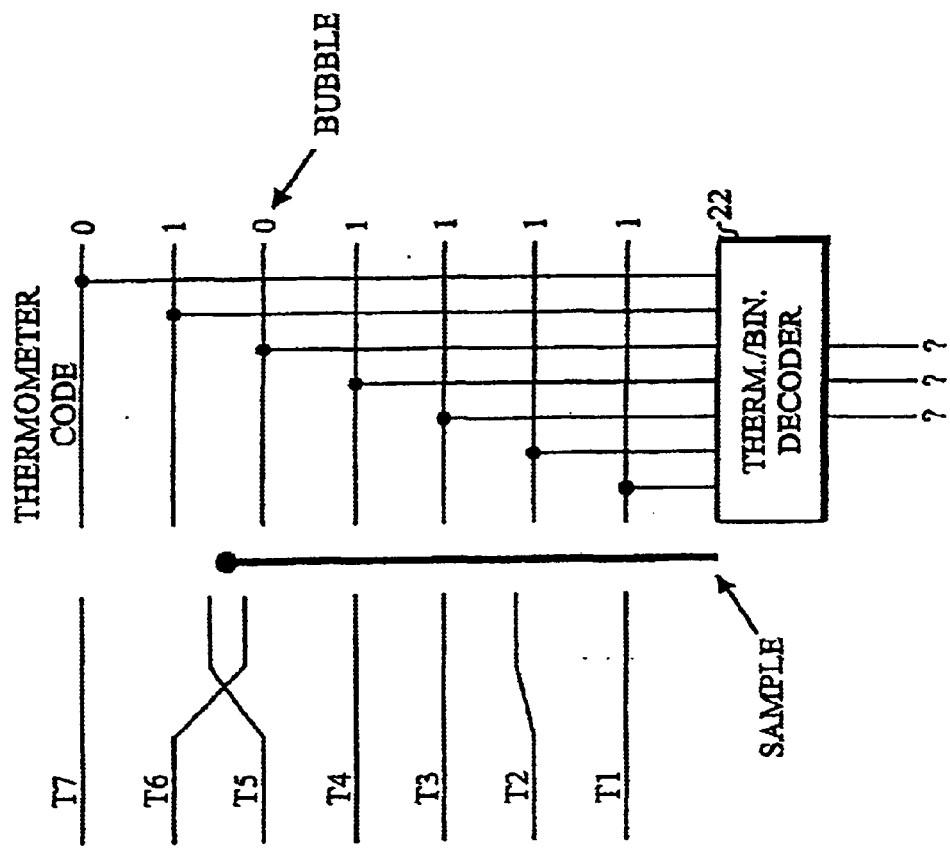
FIG. 4 is a diagram illustrating the concept of a bubble on the thermometer code bus.

Before the invention is described in detail, the concept of a thermometer code bubble will be explained with reference to FIG. 3–4.

The thermometer coded signal is transformed into a binary coded signal in a thermometer/binary decoder 22. This process is illustrated in FIG. 3. In this example a sample of the analog signal lies between thresholds T5 and T6. This implies that comparators COMP1–COMP5 will output "1", while comparators COMP6–COMP7 will output "0". Thus, the thermometer code will be 0011111, as illustrated in the figure. Typically decoder 22 includes simple logic that finds the position of the 1-to-0 transition. This position is used to select a corresponding row in ROM containing binary codes.

Figure 3:
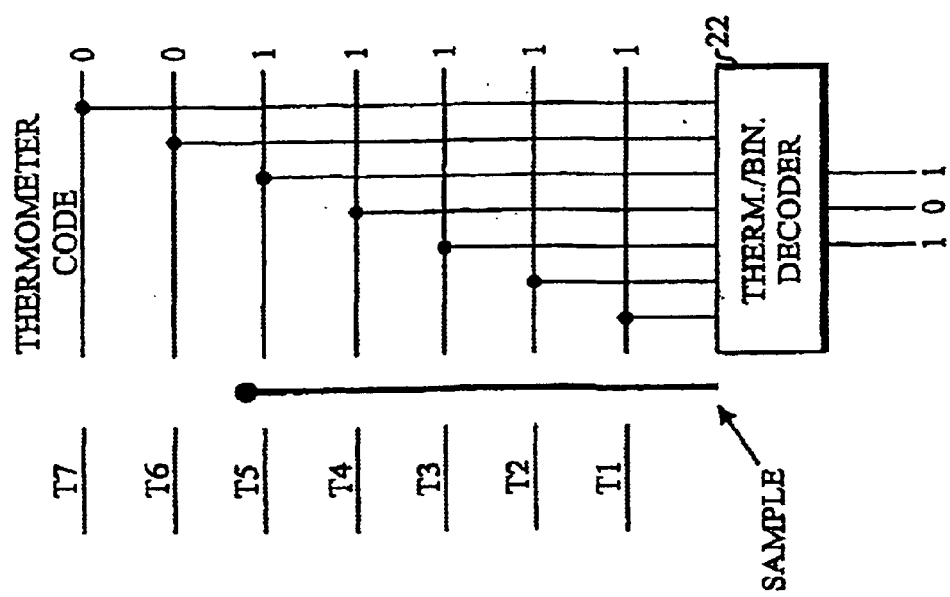
FIG. 3 is a diagram illustrating signal behavior on the thermometer code bus during normal operation of the A/D converter stage in FIG. 2.

The example described with reference to FIG. 3 is accurate for an ideal A/D converter. However, imperfections in the A/D converter may result in slight shifts of the thresholds, as indicated by T2 in FIG. 4. If these shifts are of the order of half the quantization step between two consecutive thresholds (which can be the case for high resolution converters), the order between two thresholds may be reversed, as indicated by T5 and T6 in FIG. 4. If the sample happens to lie between these reversed thresholds, the result will be a "0" output trapped between two "1" outputs. This is called a "bubble". In the example this will generate the signal 0101111 on the thermometer code bus. It is appreciated that in this case there will be two 1-to-0 transitions, one between thermometer code lines 4 and 5, and a second transition between lines 6 and 7. Since the transition point determines the row to be looked up in ROM, there will now be an ambiguity as to which binary code is to be used.

In the prior art the described ambiguity has been partially resolved by various kinds of preprocessing of the thermometer code or by fault tolerant procedures. However, large A/D converter errors will still remain, since these approaches only avoid catastrophic errors. A better approach is to eliminate the reason for the occurrence of bubbles, which is the approach taken by the present invention.

Figure 5:
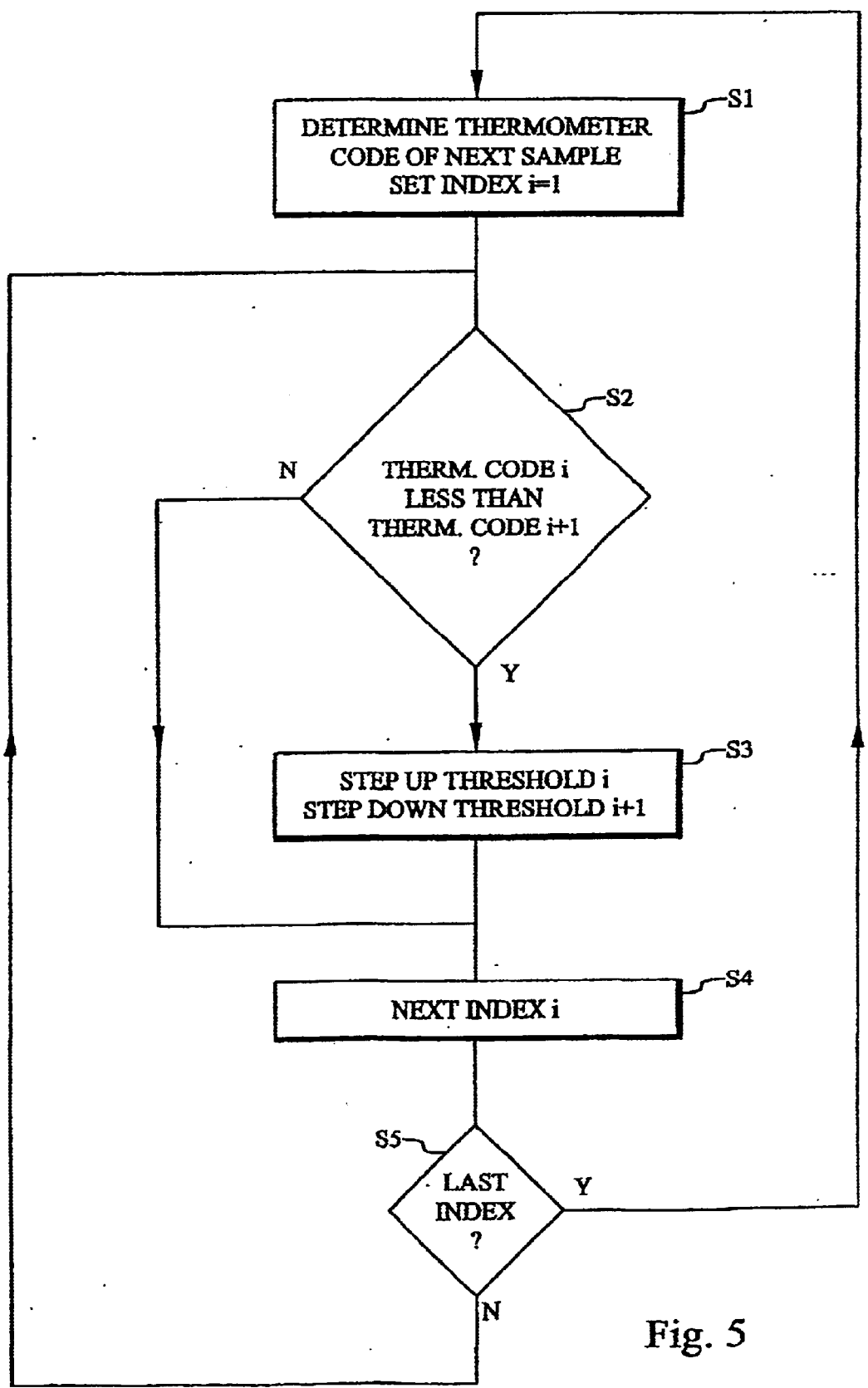
FIG. 5 is a flow chart illustrating a conceptual embodiment of the method in accordance with the present invention.

FIG. 5 is a flow chart illustrating a conceptual embodiment of the method in accordance with the present invention. The procedure starts in step S1 by determining the thermometer code of the relevant bits of the next sample and by setting the code index i=1 (corresponds to first line on the thermometer code bus). The reason for bubbles, namely crossed decision levels, can be detected by the occurrences of 0-to-1 transitions in the thermometer code when going from lower to higher thermometer code positions (in FIG. 4 such a transition occurs between positions (lines) 5 and 6). This is performed in step S2, which tests whether thermometer code i is less than thermometer code i+1. If this is the case, step S3 increases (steps up) threshold i by a first predetermined voltage and decreases (steps down) threshold i+1 by a second predetermined voltage. Preferably the predetermined voltages are equal and of the order of 5–25% of the quantization step. As an example, the correction voltage may be 1/16 of the quantization step. The procedure then proceeds to step S4, in which code index i is increased by 1. If the test in step S2 indicates that thermometer code i is not less than thermometer code i+1, the procedure proceeds directly to step S4. Step S5 tests whether code index i is the last index (7 in FIG. 4). If so, the procedure loops back to step S1. Otherwise the procedure loops back to step S2.

The described bubble handling method is useful in both single-stage flash A/D converters and in flash A/D converter stages of multi-stage or multi-step A/D converters, such as pipeline, sub-ranging and cyclic A/D converters.

The present invention is especially advantageous in multi-stage A/D converters using residual based correction methods, such as the method described in [5] Zigiang Gu and W, Martin Snelgrove, "A Novel Self-Calibrating Scheme For Video-Rate 2-Step Flash Analog-to-Digital Converter", IEEE International Symposium on Circuits and Systems, Vol. 4, pp. 601–604, 1992; and [6] Zigiang Gu and W, Martin Snelgrove, "Application of a novel self calibration scheme to a video-rate pipelined multi-stage A/D converter", IEEE, 1992; since these methods heavily rely on a bubble-free thermometer code. Such an embodiment is illustrated by the flow chart in FIG. 6. In this flow chart steps S1–S5 are the same as in the embodiment of FIG. 5. If step S2 determines that there is no bubble at thermometer code position i, step S6 determines whether code i is greater than code i+1, i.e. whether this position corresponds to the thermometer code transition 1-to-0. If this is not the transition position, the procedure proceeds to step S4. Otherwise step S7 tests whether the residual signal from this converter stage exceeds a maximum allowable value. If so, step S8 decreases threshold i+1 by a predetermined voltage. If the residual is not too large, step S9 tests whether it falls below a predetermined minimum allowable value. If so, step S10 increases threshold i by a predetermined voltage. Otherwise the procedure proceeds to step S4. Preferably the predetermined voltages in steps S8 and S10 are equal and of the order of 5–25% of the quantization step. These voltages may also be equal to the voltages in step S3. As an example, the correction voltage may be 1/16 of the quantization step. The maximum and minimum values may, for example, be the expected maximum and minimum residual values for an ideal A/D subconverter.

Since the calibration method described with reference to FIG. 6 relies on detection of an unambiguous 1-to-0 thermometer code transition, it is appreciated that it is sensitive to bubbles. Thus bubble elimination in accordance with the present invention is essential for proper operation of this method.

Figure 6:
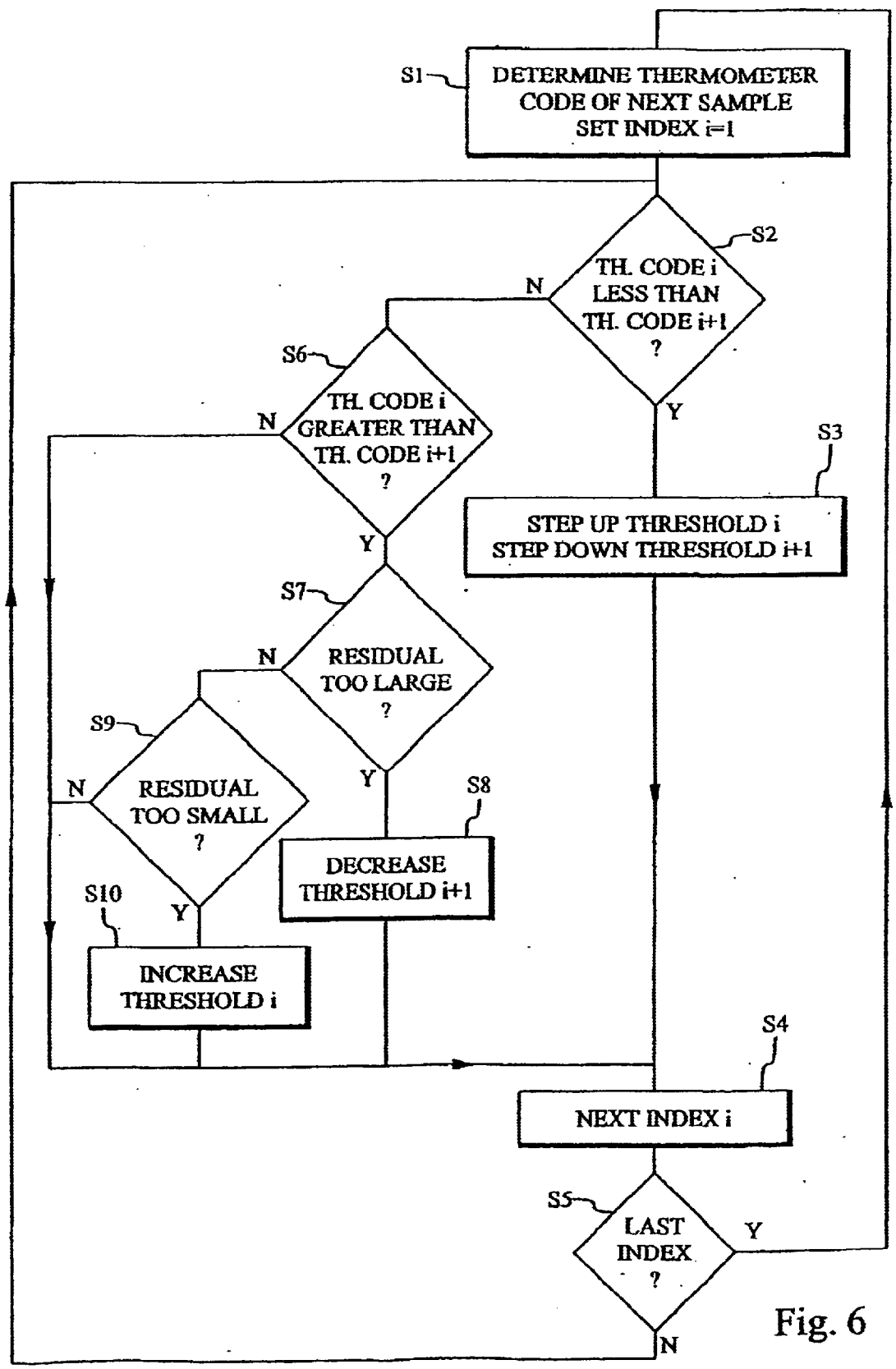
FIG. 6 is a flow chart illustrating another conceptual embodiment of the method in accordance with the present invention.

In the embodiment in FIG. 6 the residual based calibration is inhibited when a bubble is detected. This is, however, not absolutely necessary. Although the calibration will be less accurate in the presence of bubbles, these bubbles will eventually be eliminated by the present invention, and thereafter the residual based calibration will not be influenced by bubbles.

In the methods described with reference to FIG. 5 and 6 the thermometer code lines were examined in succession. However, as will be illustrated below with reference to 7–11, all lines may also be examined in parallel.

An exemplary embodiment of an A/D converter calibration apparatus will now be described with reference to FIG. 7–11.

Figure 7:
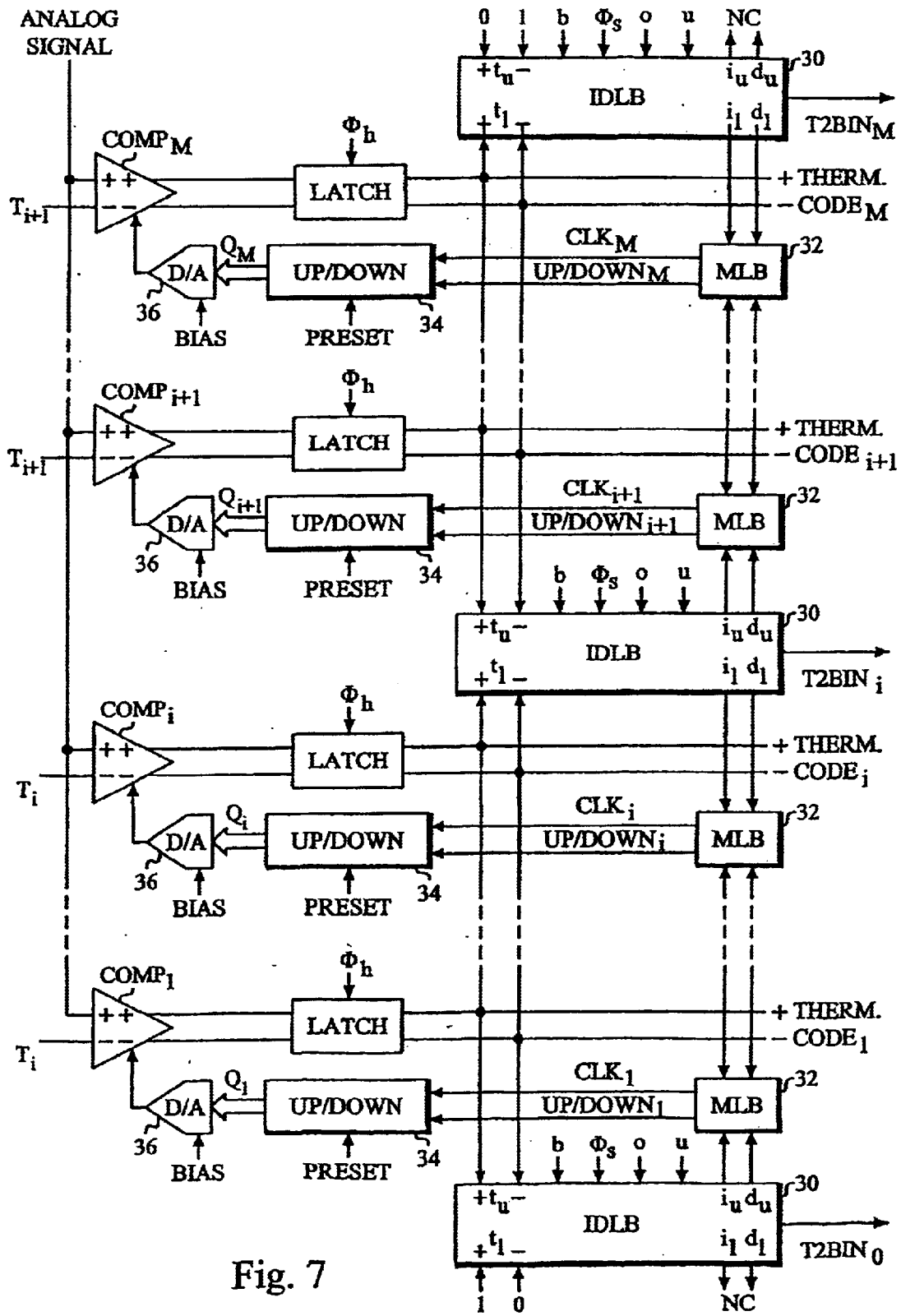
FIG. 7 is a block diagram illustrating an exemplary embodiment of an A/D converter calibration apparatus in accordance with the present invention.

FIG. 7 is a block diagram illustrating an exemplary differential embodiment of an A/D converter calibration apparatus in accordance with the present invention. The figure illustrates the calibration logic of the A/D subconverter comparator array of an A/D converter stage. Increase/decrease logic blocks (IDLB) 30 are positioned between each comparator pair in the array and also at the top and bottom of the array. These blocks determine whether the adjacent comparator transition levels should be increased, unchanged or decreased based on the comparator output codes and residual overflow and underflow signals o and u, respectively, from the succeeding A/D converter stage. The thermometer code inputs $t_u$ and $t_l$, respectively, of the top and bottom IDLB-blocks have no connections to comparator outputs and are instead held at the (constant) potentials that would result from an extended comparator array within range input signals. Merge logic blocks (MLB) 32 associated with each comparator combine the increase/decrease signals from neighboring IDLB-blocks into a clock signal CLK and an UP/DOWN signal (the top outputs of the top IDLB-block and the bottom outputs of the bottom IDLB-block are not connected (NC) to any MLB-block). These signals control a respective up/down counter 34 that provides a respective calibrating D/A converter 36 with calibration data. The calibrating D/A converter is connected to the associated comparator, where it adjusts the comparator offset, thereby adjusting the comparator threshold.

Figure 8:
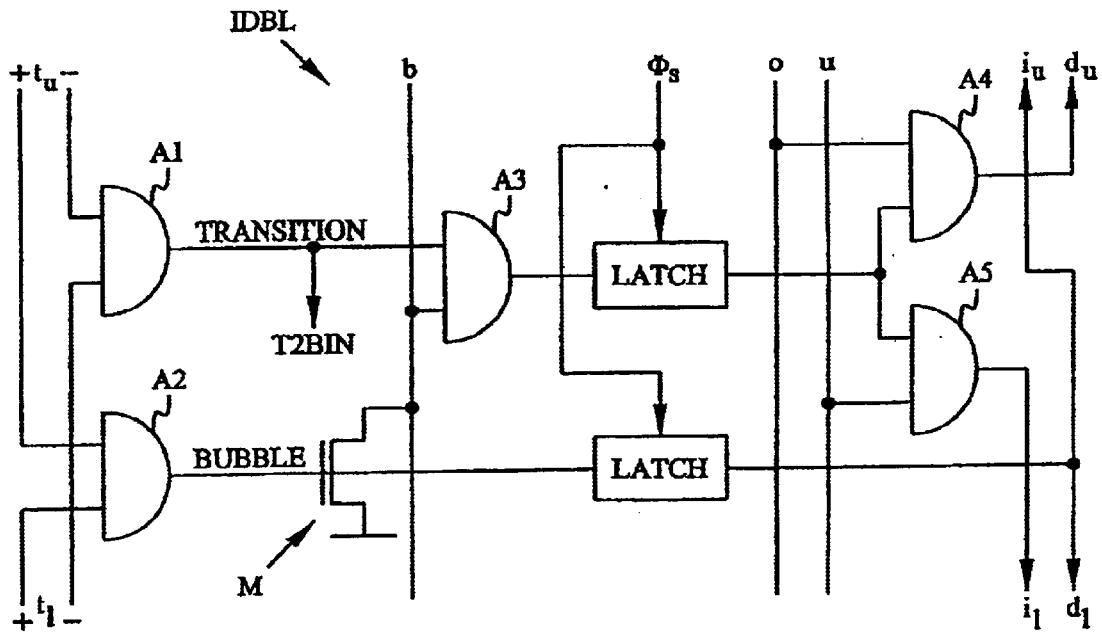
FIG. 8 is a block diagram of an exemplary embodiment of an increase/decrease logic block (IDLB) in FIG. 7.

FIG. 8 is a block diagram of an exemplary embodiment of increase/decrease logic block (IDLB) in FIG. 7. Two AND gates A1 and A2 detect transitions and bubbles, respectively, from the thermometer codes of neighboring comparators. The transition signals T2BIN are propagated to thermometer/binary decoder 22 (FIG. 3). In case of a detected bubble, transistor M pulls down line b. This signals a detected bubble to all IDBL-blocks, thereby inhibiting further activity (corresponding to steps S6–S10 in FIG. 6) due to detected transitions. The static power consumption when line b is pulled down is of no concern, since the bubbles will be rapidly eliminated. When the bubble signal has been time aligned by a latch controlled by a clock phase signal $\Phi_s$, the increase and decrease commands $i_u$, and $d_l$, respectively, can be given directly to the adjacent comparators. If there is no bubble, the transition signal passes AND gate A3, and after time alignment it is gated to both signals u and o to determine if any decrement or increment signals $d_u$ and $i_l$, respectively, should be passed on to the adjacent comparators.

Figure 9:
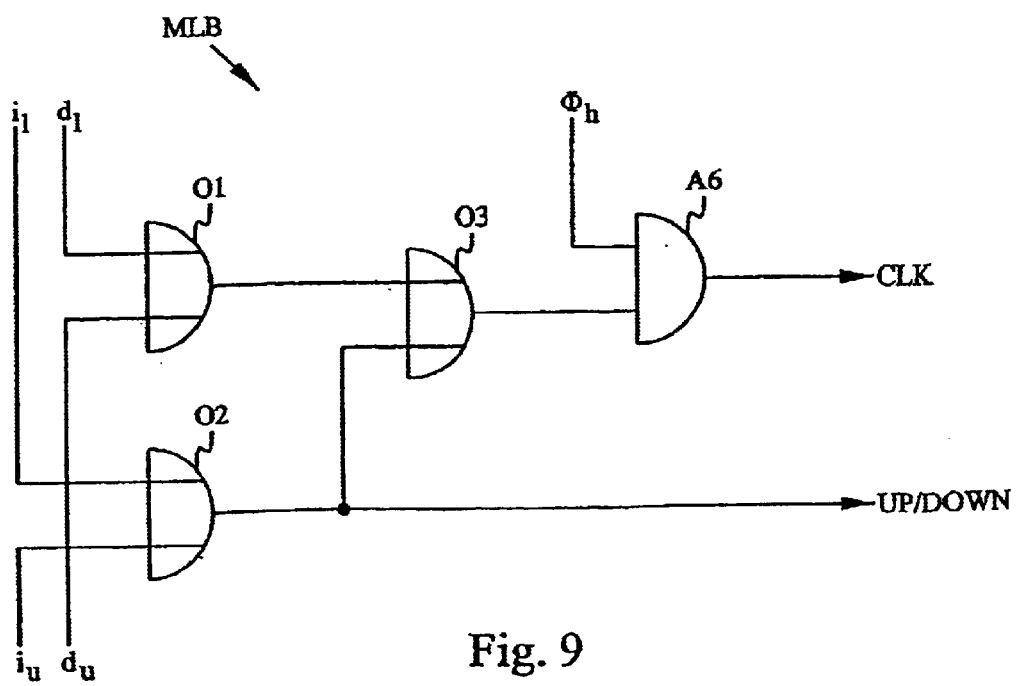
FIG. 9 is a block diagram of an exemplary embodiment of a merge logic block (MLB) in FIG. 7.

FIG. 9 is a block diagram of an exemplary embodiment of a merge logic block (MLB) in FIG. 7. The decrement or increment signals $d_u$ and $i_l$, respectively, to a comparator are merged in OR gates O1 and O2. An OR gate O3 detects if there were any signals to the MLB-block, and an AND gate A6 gates the resulting signal with a clock phase signal $\Phi_h$ to avoid generation of false CLK pulses due to transients. The UP/DOWN signal is produced by O2 and is high only in the presence of increment signals. The CLK and UP/DOWN signals are used to control up/down counter 34.

Figure 10:
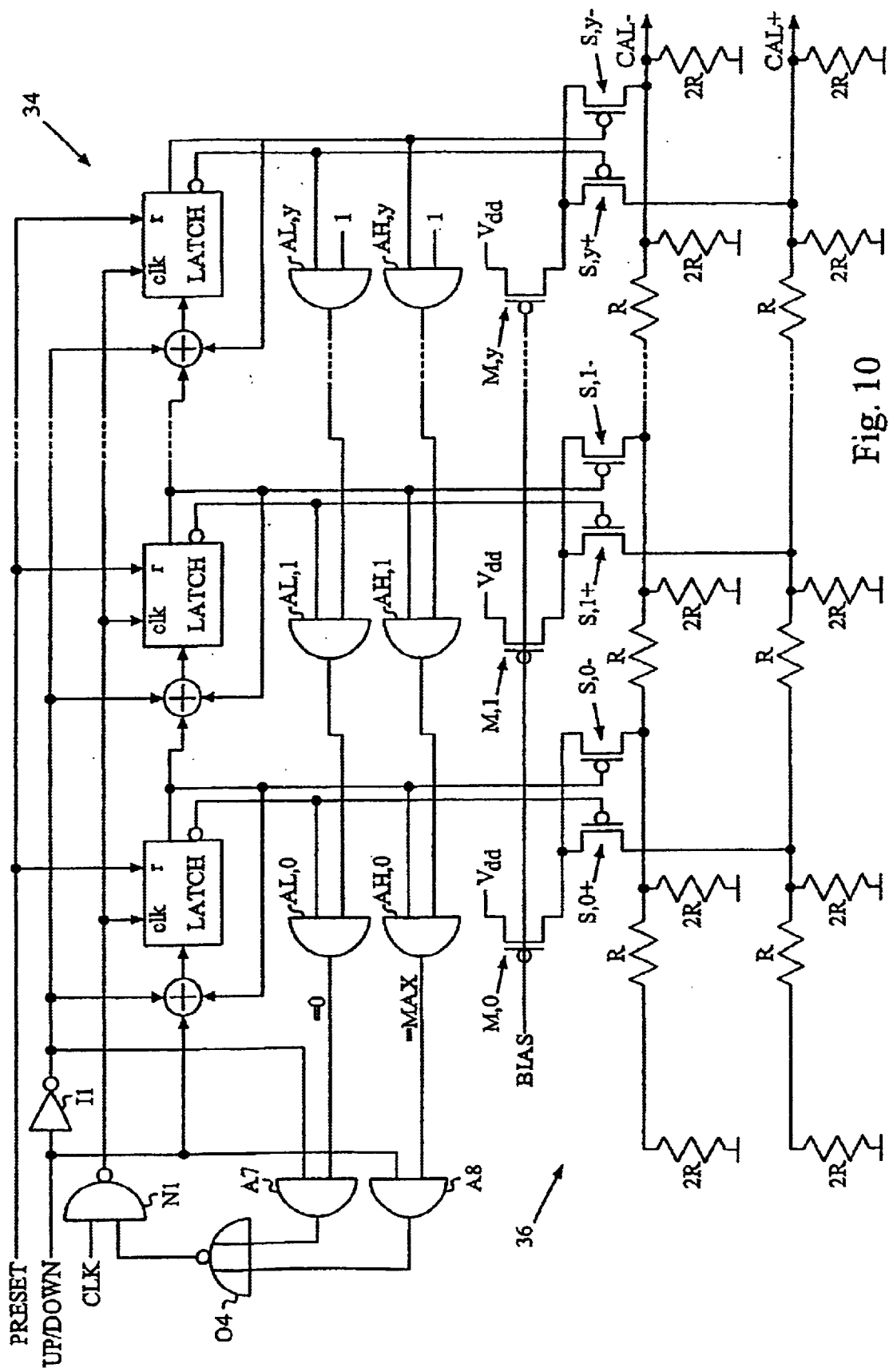
FIG. 10 is a block diagram of an exemplary embodiment of an up/down counter and calibrating D/A converter in FIG. 7.

FIG. 10 is a block diagram of an exemplary embodiment of an up/down counter and calibrating D/A converter in FIG. 7. To avoid the counter to wrap around its lowest and highest values (0 and MAX) in case the calibration range is not adequate, the CLK signal is gated. The AND gates AL,x and AH,x in the counter chain are used to determine if the counter is at its minimum (0) or maximum (MAX) value, respectively. If it is at its minimum value, gates A7, A8, O4 and N1 will block clock pulses that would otherwise decrement the counter. On the other hand, if the counter is at its maximum value, further incrementing will be inhibited. The clock signal CLK to the positive edge triggered latches is inverted by NAND gate N1 to allow as much settling time as possible to the counter chain after a change in the UP/DOWN signal. By not using a continuous clock and only clocking the counters in the event of adjustments, which will be rare as soon as the calibration values have settled, unnecessary power consumption and circuit noise are avoided. A PRESET signal can be used to initially put the counter to its mid position by setting/resetting the latches, but this function is optional.

The up/down counter 34 controls switches S,x that direct the currents of current sources M,x to the CAL+ and CAL− branches of the output signal in accordance with the counter value. The directed currents are binary weighted to the calibrating D/A converter output by a resistance network to form a differential voltage output corresponding to the counter value.

Figure 11:
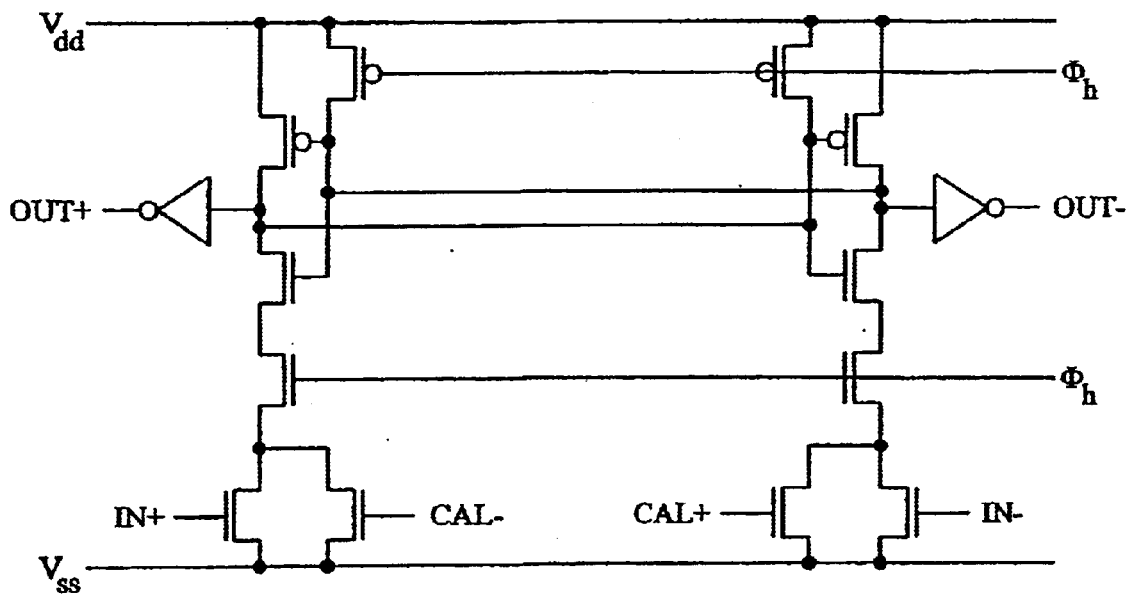
FIG. 11 is a block diagram of an exemplary embodiment of a combined comparator and latch.

FIG. 11 is a block diagram of an exemplary embodiment of a combined comparator and latch. It is noted that the polarity of the calibration inputs are reversed with respect to the normal inputs for obtaining a correct adjustment of the threshold levels.

Figure 12:
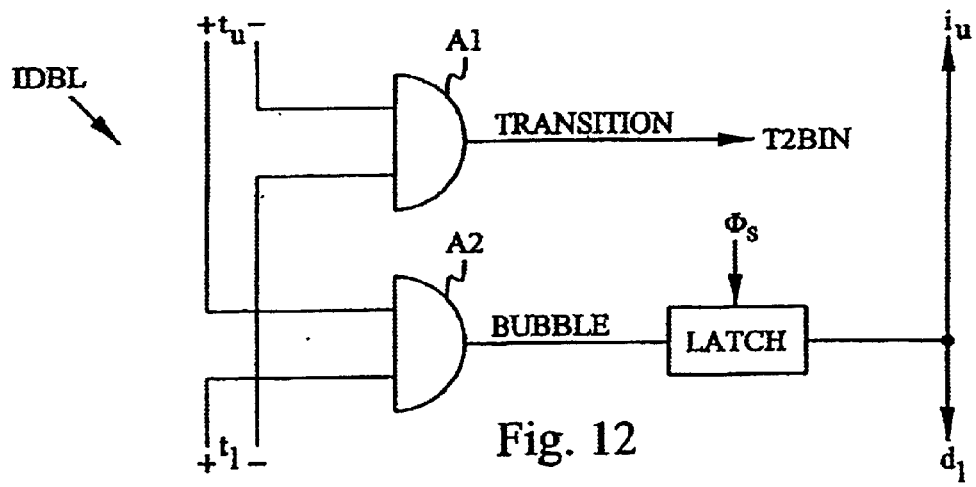
FIG. 12 is a block diagram of a simplified embodiment of an increase/decrease logic block (IDLB) in FIG. 7.
Figure 13:
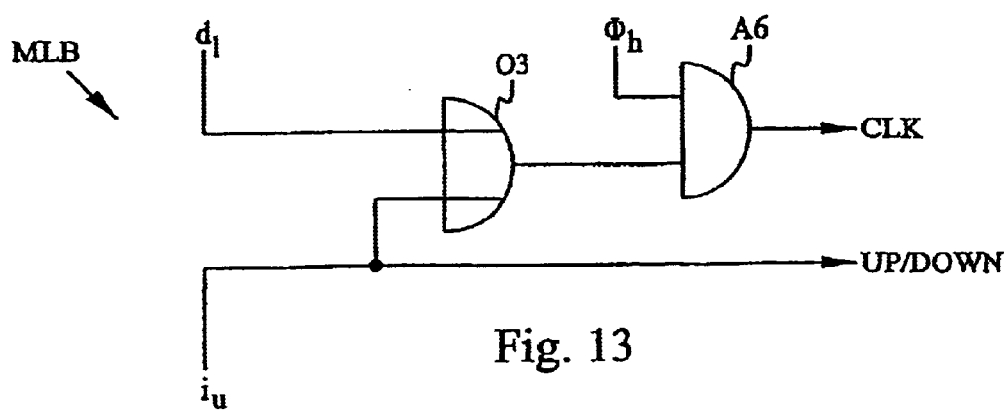
FIG. 13 is a block diagram of a simplified embodiment of a merge logic block (MLB) in FIG. 7.

The embodiment described above with reference to FIG. 7–11 performs both adjustments for removal of bubbles and for residual based calibration when the bubbles have been removed. However, in a flash A/D converter, which performs the digitalization of all bits in a single stage, no residual based calibration is possible (although other calibration methods may be used in this case). The same comment applies to the last stage in a multi-stage A/D converter. In these cases the IDLB-block and the MLB block may be significantly simplified, as illustrated in FIG. 12 and 13, respectively.

The described embodiments adjust the thresholds by adjusting the comparator offsets. However, it is appreciated that the same principles may be used to adjust the thresholds directly in threshold generator 22 (FIG. 2).

The present invention will allow an increase in performance, yield and/or simplified analog design, since the trade-off between speed and accuracy can be reduced. The offered possibility of continuous background calibration eliminates performance degradation due to drift while avoiding frequent disturbing interrupts for calibration.

It will be understood by those skilled in the art that various modifications and changes may be made to the present invention without departure from the scope thereof, which is defined by the appended claims.

What is claimed is:

1. A calibration method handling occurrences of thermometer code bubbles in an A/D sub-converter in an A/D converter stage, including the steps of:
   detecting two A/D sub-converter comparators causing a bubble;
   increasing a threshold of the bubble causing comparator having the lowest threshold by a first predetermined voltage; and
   decreasings a threshold of the bubble causing comparator having the highest threshold by a second predetermined voltage.

2. The method of claim 1, wherein said first and second voltages are fractions of the A/D sub-converter quantization step.

3. The method of claim 2, wherein said first voltage is equal to said second voltage.

4. The method of claim 1, including the steps of:
   determining a last A/D sub-converter comparator having a threshold that is smaller than an analog A/D sub-converter input signal;
   increasing a threshold of said determined comparator by a third predetermined voltage if a residual signal from said A/D converter stage falls below a predetermined minimum level; and
   decreasing the threshold of the first A/D sub-converter comparator having a threshold that is larger than said analog A/D sub-converter input signal by a fourth predetermined voltage if said residual signal exceeds a predetermined maximum level.

5. The method of claim 4, wherein said third and fourth voltages are fractions of the A/D sub-converter quantization step.

6. The method of claim 5, wherein said third voltage is equal to said fourth voltage.

7. The method of any of the preceding claims, wherein said thresholds are modified by modifying comparator offsets.

8. A calibration apparatus handling occurrences of thermometer code bubbles in an A/D sub-converter in an A/D converter stage, comprising:
   means for detecting two A/D sub-converter comparators causing a bubble;
   means for increasing a threshold of the bubble causing comparator having the lowest threshold by a first predetermined voltage; and
   means for decreasing a threshold of the bubble causing comparator having the highest threshold by a second predetermined voltage.

9. The apparatus of claim 8, further comprising:
   means for determining a last A/D sub-converter comparator having a threshold that is smaller than an analog A/D sub-converter input signal;

means for increasing a threshold of said determined comparator by a third predetermined voltage if a residual signal from said A/D converter stage falls below a predetermined minimum level; and means for decreasing a threshold of a first A/D sub-converter comparator having a threshold that is larger than said analog A/D sub-converter input signal by a fourth predetermined voltage if said residual signal exceeds a predetermined maximum level.

10. The apparatus of claim 8, further comprising means for modifying said thresholds by modifying comparator offsets.

11. A multi-stage A/D converter including a calibration apparatus handling occurrences of thermometer code bubbles in an A/D sub-converter in at least one A/D converter stage, said calibration apparatus comprising:

means for detecting two A/D sub-converter comparators causing a bubble;

means for increasing a threshold of the bubble causing comparator having the lowest threshold by a first predetermined voltage; and means for decreasing a threshold of the bubble causing comparator having the highest threshold by a second predetermined voltage.

12. The multi-stage A/D converter of claim 11, said calibration apparatus comprising:

means for determining a last A/D sub-converter comparator having a threshold that is smaller than an analog A/D sub-converter input signal;

means for increasing a threshold of said determined, comparator by a third predetermined voltage if a residual signal from said A/D converter stage falls below a predetermined minimum level; and means for decreasing a the threshold of the first A/D sub-converter comparator having a threshold that is larger than said analog A/D subconverter input signal by a fourth predetermined voltage if said residual signal exceeds a predetermined maximum level.

13. The multi-stage A/D converter of claim 11, further comprising means for modifying said thresholds by modifying comparator offsets.

14. A flash A/D converter handling occurrences of thermometer code bubbles, comprising:

means for detecting two A/D converter comparators causing a bubble;

means for increasing a threshold of the bubble causing comparator having the lowest threshold by a first predetermined voltage; and means for decreasing a threshold of the bubble causing comparator having the highest threshold by a second predetermined voltage.

15. The flash A/D converter of claim 14, further comprising means for modifying said thresholds by modifying comparator offsets.

* * * * *